US007164317B1

(12) United States Patent
Lorenz

(10) Patent No.: US 7,164,317 B1
(45) Date of Patent: Jan. 16, 2007

(54) APPARATUS AND METHOD FOR A LOW-VOLTAGE CLASS AB AMPLIFIER WITH SPLIT CASCODE

(75) Inventor: Perry Scott Lorenz, Fort Collins, CO (US)

(73) Assignee: National Semiconductor Corporation, Santa Clara, CA (US)

( * ) Notice: Subject to any disclaimer, the term of this patent is extended or adjusted under 35 U.S.C. 154(b) by 88 days.

(21) Appl. No.: 11/003,299

(22) Filed: Dec. 3, 2004

(51) Int. Cl.
*H03F 3/45* (2006.01)
(52) U.S. Cl. ........................ 330/255; 330/265; 330/267
(58) Field of Classification Search ............... 330/255, 330/261, 260, 265, 267
See application file for complete search history.

(56) References Cited

U.S. PATENT DOCUMENTS

| | | | | |
|---|---|---|---|---|
| 5,442,320 A | * | 8/1995 | Kunst et al. | ................. 330/267 |
| 5,598,129 A | * | 1/1997 | Chambers | .................... 330/255 |
| 6,154,092 A | * | 11/2000 | Lee et al. | ..................... 330/51 |
| 6,781,463 B1 | * | 8/2004 | Burt | ........................... 330/255 |
| 6,828,855 B1 | * | 12/2004 | Wang | .......................... 330/253 |

OTHER PUBLICATIONS

M. Jeroen Fonderie and Johan H. Huijsing, "Design of Low-Voltage Bipolar Operational Amplifiers", Kluwer Academic Publishers, pp. 78-89.
Fan You et al., Low-Voltage Class AB Buffers with Quiescent Current Control, IEEE Journal of Solid-State Circuits, vol. 33, No. 6, Jun. 1998, pp. 915-920.

* cited by examiner

*Primary Examiner*—Patricia Nguyen
(74) *Attorney, Agent, or Firm*—Darby & Darby P.C.; Matthew M. Gaffney

(57) ABSTRACT

An op amp is arranged for low-voltage, rail-to-rail operation with a class AB output. The op amp includes a transconductance input stage, a folded cascode middle stage that includes a split cascode, a high-side driver, a low-side driver, a sampling circuit, and a split-cascode bias circuit. The split cascode includes two cascode transistors with their sources coupled to each other. Also, the sampling circuit that is arranged to sample the high-side driver current and the low-side sample current. The split cascode bias current is arranged to compare the sample current with a reference current, and to provide bias voltages to the gates of the two cascode transistors in the split cascode.

20 Claims, 7 Drawing Sheets

APPARATUS AND METHOD FOR A LOW-VOLTAGE CLASS AB AMPLIFIER WITH SPLIT CASCODE

FIELD OF THE INVENTION

The invention is related to class AB amplifiers, and in particular, to a low-voltage class AB op amp including a folded cascode with a split cascode biased with negative feedback.

BACKGROUND OF THE INVENTION

The cascode is a well-known configuration with numerous applications, including avoiding the Miller effect, increasing voltage gain, and current buffering. For a cascode configuration, a common-source stage (or other transconductance stage) is coupled to a common-gate transistor. The common-gate transistor is often referred to as a "cascode transistor". According to one usage of the word "cascode", the transconductance stage (e.g. common-source transistor or differential pair) and the common-gate transistor coupled together is referred to as a "cascode". According to another usage of the word "cascode", which is the usage employed in this document, the "cascode" does not necessarily include the transconductance stage. Instead, to refer inclusively to the transconductance stage and a cascode transistor (and possibly other circuitry) the term "cascode amplifier", "cascode OTA", or the like, is used in this document.

Examples of cascode configurations include the telescopic cascode configuration and the folded cascode configuration.

FIG. 1A illustrates cascode amplifier 101, which is arranged in a telescopic cascode configuration. Transistor M1 is arranged in a common-source configuration, and provides current Icasc_in based on voltage Vin. Also, cascode 107 includes cascode transistor M0, which is arranged to provide current Icasc_out from current Icascode_in. Cascode transistor M0 provides a non-inverting voltage gain, and provides a current gain of substantially one. Cascode transistor M0 is arranged to receive cascode bias voltage Vcascode_bias at its gate.

FIG. 1B shows folded cascode OTA 102. Voltage Vin may be single-ended or differential. Gm stage 111 provides current Igm_out from voltage Vin. Folded cascode 103 provides current Icascode_out from current Igm_out. Current source IC1 provides a DC bias current. As with cascode transistor M0, cascode transistor M2 provides a non-inverting voltage gain, and provides a current gain of substantially one.

FIG. 1C illustrates folded cascode OTA 104 and active load 106. Folded cascode OTA 104 is similar to folded cascode OTA 102 of FIG. 1B, except that current Igm_out is differential. As with cascode transistors M0 and M2, cascode transistor M3 provides current Icascode_out from current Icascode_in, and provides a non-inverting voltage gain, and a current gain of substantially one. Transistors M5 and M6 are arranged to provide DC bias currents. Further, node N0 is a high-impedance node since it is coupled to the output of cascode transistor M3 and active load 106. Current Icascode_out is converted into voltage Vcasc_out at node N0 due to the impedance at node N0.

BRIEF DESCRIPTION OF THE DRAWINGS

Non-limiting and non-exhaustive embodiments of the present invention are described with reference to the following drawings, in which.

DETAILED DESCRIPTION

Figures 1A, 1B:
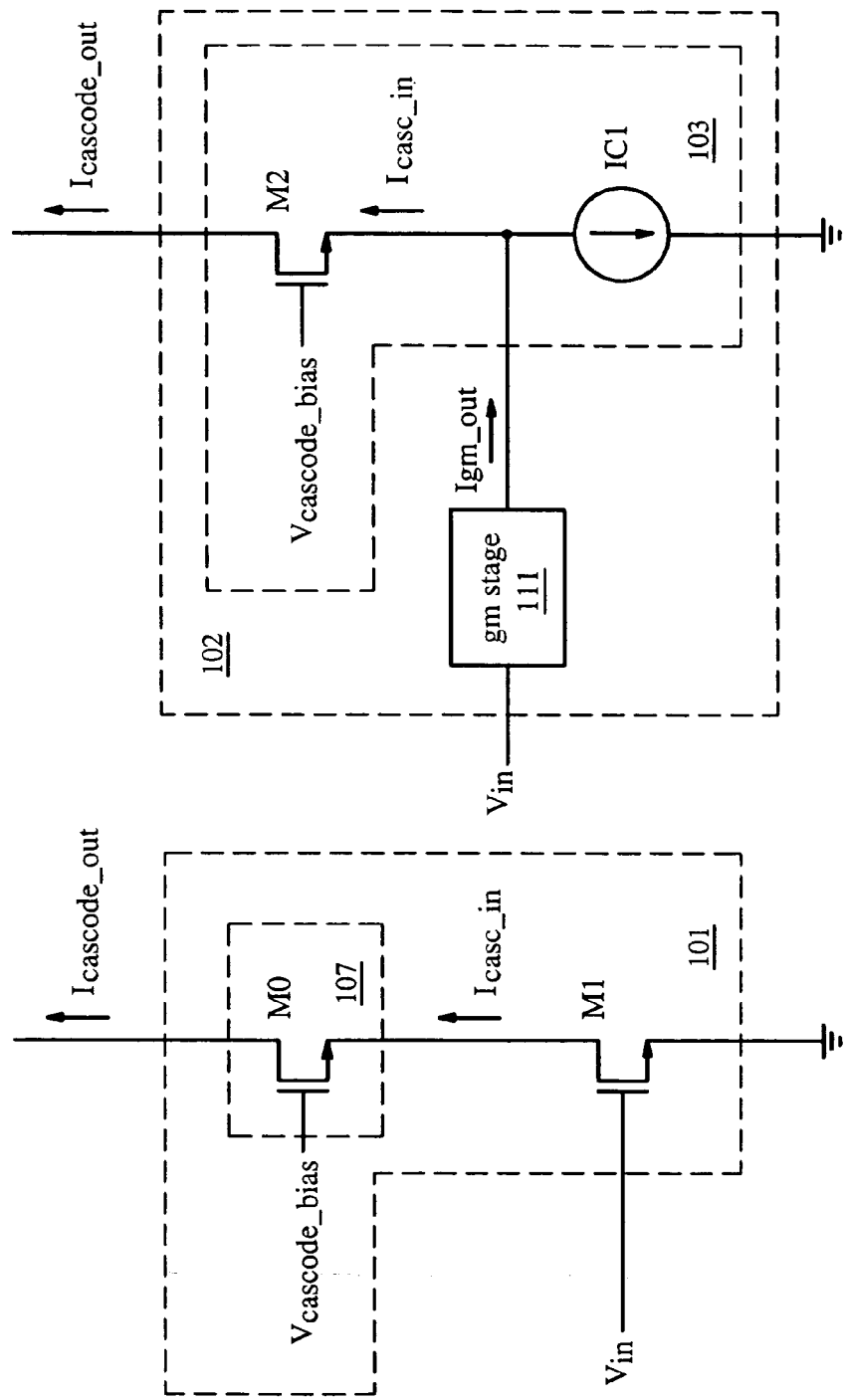
FIGS. 1a–1c illustrate block diagrams of examples of cascode configurations.
Figure 1C:
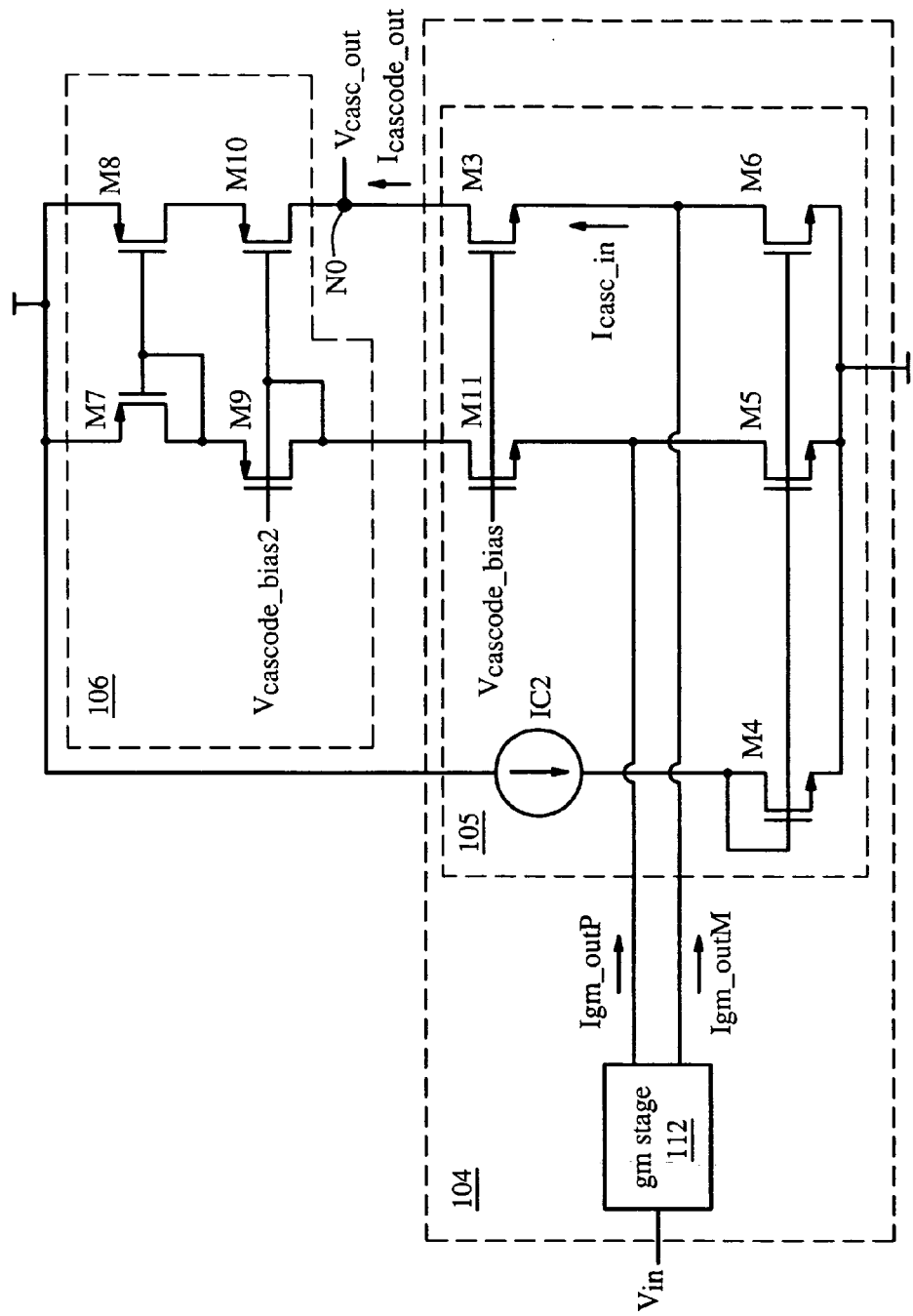

Various embodiments of the present invention will be described in detail with reference to the drawings, where like reference numerals represent like parts and assemblies throughout the several views. Reference to various embodiments does not limit the scope of the invention, which is limited only by the scope of the claims attached hereto. Additionally, any examples set forth in this specification are not intended to be limiting and merely set forth some of the many possible embodiments for the claimed invention.

Throughout the specification and claims, the following terms take at least the meanings explicitly associated herein, unless the context dictates otherwise. The meanings identified below do not necessarily limit the terms, but merely provide illustrative examples for the terms. The meaning of "a," "an," and "the" includes plural reference, and the meaning of "in" includes "in" and "on." The phrase "in one embodiment," as used herein does not necessarily refer to the same embodiment, although it may. The term "coupled" means at least either a direct electrical connection between the items connected, or an indirect connection through one or more passive or active intermediary devices. The term "circuit" means at least either a single component or a multiplicity of components, either active and/or passive, that are coupled together to provide a desired function. The term "signal" means at least one current, voltage, charge, temperature, data, or other signal. Where either a field effect transistor (FET) or a bipolar junction transistor (BJT) may be employed as an embodiment of a transistor, the scope of the words "gate", "drain", and "source" includes "base", "collector", and "emitter", respectively.

Briefly stated, the invention is related to an amplifier that is arranged for low-voltage, rail-to-rail operation with a class AB output. The amplifier includes a transconductance input stage, a folded cascode middle stage that includes a split cascode, a high-side driver, a low-side driver, a sampling circuit, and a split-cascode bias circuit. The split cascode includes two cascode transistors with their sources coupled to each other. Also, the sampling circuit may be arranged to sample the high-side driver current and the low-side sample current. The split cascode bias current is arranged to compare the sample current with a reference current, and to provide bias voltages to the gates of the two cascode transistors in the split cascode.

Figure 2:
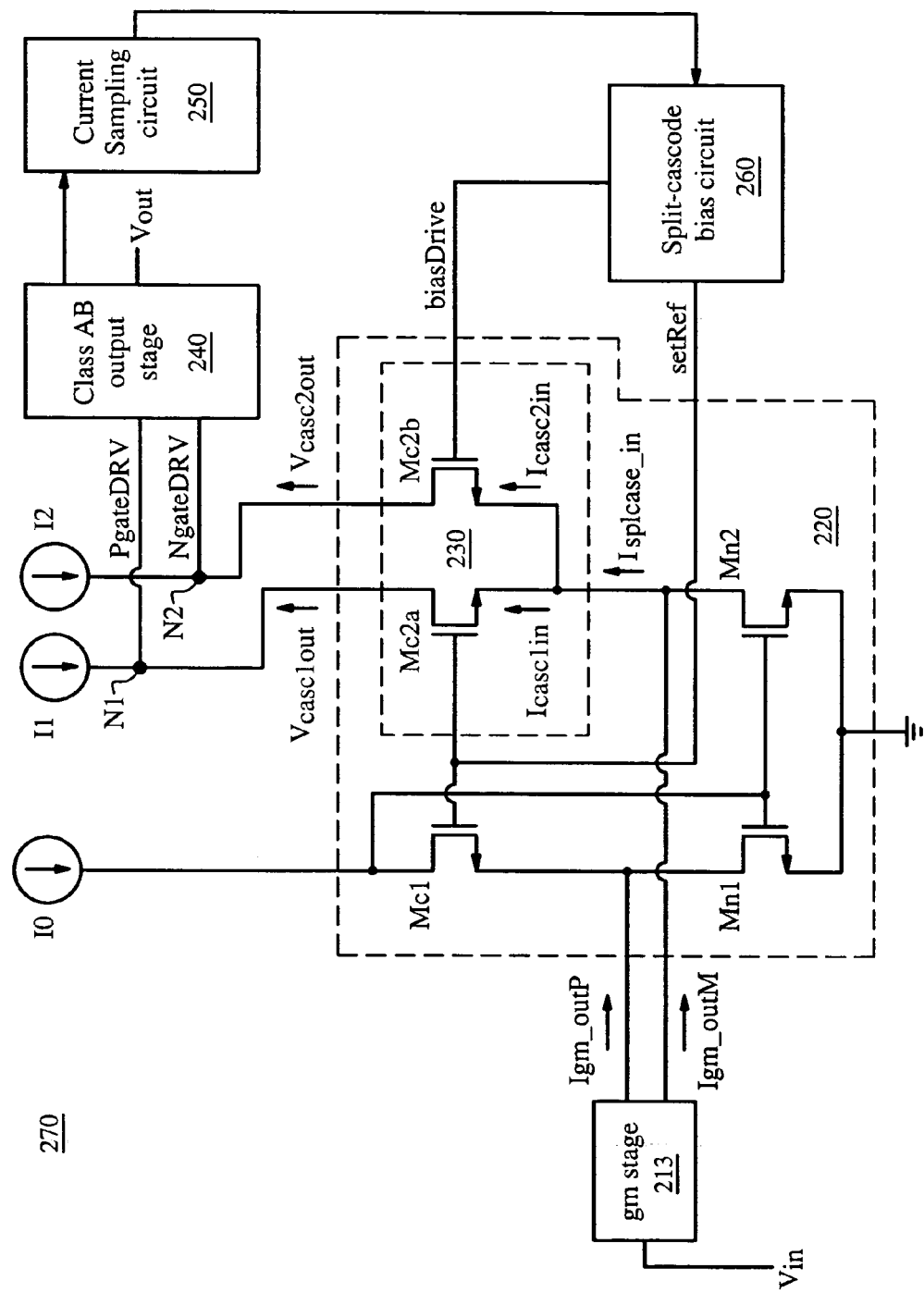
FIG. 2 shows a block diagram of an embodiment of a class AB amplifier that includes a folded cascode with a split cascode.

FIG. 2 shows a block diagram of an embodiment of class AB amplifier 270. Class AB amplifier 270 includes gm stage 213, folded cascode 220, current sources 10–12, class AB output stage 240, current sampling circuit 250, and split-cascode bias circuit 260. Folded cascode 220 includes transistors Mn1, Mn2, and Mc1; and split cascode 230. Split cascode 230 includes transistor Mc2a and transistor Mc2b.

In one embodiment, gm stage 213 is an input stage. Gm stage 213 is arranged to provide differential current Igm_out (including Igm_outP and Igm_outM) such that current Igm_out is substantially proportional to differential input voltage Vin. Also, current source I0 is arranged to provide a DC bias current to transistor Mc1, current source I1 is arranged to provide a DC bias current to transistor Mc2a, and current source I2 is arranged to provide a DC bias current to transistor Mc2b. In one embodiment, the DC bias current provided by each current source I1 and I2 is half of the DC bias current provided by current source I0. Current sources I1 and I2 each operate as active loads to contribute to the high impedance at nodes N1 and N2, respectively.

Folded cascode 220 is arranged to provide split cascode input current Isplasc_in such that current Isplcas_in is substantially proportional to differential current Igm_out.

Current Isplcasc_in is affected by Igm_outP as well as Igm_outM. If current Igm_outP increases, it may tend to de-bias Mc1, so that the voltage at the drain of transistor Mc1 increases to maintain the current provided by current source I0. Since the drain of transistor Mc1 is coupled to the gate of transistor Mn2, the drain current of transistor Mn2 increases when the drain voltage of transistor Mc1 increases.

Additionally, split cascode 230 is arranged to split cascode input current Isplcasc_in into currents Icasc1in and Icacs2in based on split cascode bias voltages biasDrive and setRef.

Transistors Mc1, Mc2a, and Mc2b are cascode transistors. Cascode transistor Mc2a is arranged to provide current Icasc1out from current Icasc1in, and cascode transistor Mc2b is arranged to provide current Icasc2out from current Icasc2in. Cascode transistors Mc2a and Mc2b each provide a current gain of substantially one.

During operation, split cascode 230 may perform (at least) three functions in class AB amplifier circuit 270. First, split cascode 230 operates as a cascode. Second, split cascode 230 operates as a signal splitter which provides two signals of substantially the same phase. Third, split cascode 230 provides class AB biasing for class AB output stage 240 based on split cascode bias voltages biasDrive and setRef.

Because node N1 is coupled to the output of current source I1 and cascode transistor Mc2a, node N1 is a very high impedance node. Similarly, node N2 is a very high impedance node.

Current Icasc1_out is converted to voltage PgateDRV by the impedance at node N1, and current Icasc2_out is converted to voltage NgateDRV by the impedance at node N2.

Additionally, class AB output stage 240 is arranged to provide output voltage Vout based on voltages PgateDRV and NgateDRV. Class AB output stage 240 includes a high-side driver transistor (not shown in FIG. 2) that is driven by voltage PgateDRV, and a low-side driver transistor (not shown in FIG. 2) that is driven by voltage Ngate DRV.

Also, split-cascode bias circuit 260 and current sampling circuit 250 provide a sample-and-feedback function to adjust the quiescent current of class AB output stage 240 through negative feedback for class AB biasing. Current sampling circuit 250 is arranged to sample one or both of the current associated with the high-side driver transistor and the current associated with the low-side driver transistor. Further, current sampling circuit 250 is arranged to provide a sampled current(s) that is substantially proportional to the current associated with the high-side driver transistor and/or the current associated with the low-side driver transistor.

Split-cascode bias circuit 260 is arranged to provide cascode bias signals biasDrive and setRef based on the sampled current. In one embodiment, signal setRef is a reference voltage. Split-cascode bias circuit 260 is part of a negative feedback loop for controlling quiescent current in class AB output stage 240 to provide class AB biasing.

In one embodiment, with double sampling, signal bias-Drive is roughly proportional to the smaller of the sampled currents, as further adjusted by a bias current in split-cascode bias circuit 260. In one embodiment, with single sampling, signal biasDrive is roughly proportional to the sampled current if the sampled current is smaller than a reference current, as further adjusted by a bias current in split-cascode bias circuit 260.

Split cascode 230 is arranged to cause voltages PgateDRV and NgateDRV to be in phase, so that if differential voltage Vin increases, voltages PgateDRV and NgateDRV both increase. Similarly, if differential voltage Vin decreases, voltages PgateDRV and NgateDRV both decrease.

Conversely, voltages PgateDRV and Ngate DRV move in opposition to each other based on the negative feedback of voltage biasDrive. For example, in one embodiment, if voltage biasDrive is greater than voltage setRef, voltage PgateDRV is increased and voltage NgateDRV is decreased, to reduce the bias in both the high-side and low-side driver transistors.

Although a particular embodiment has been described with respect to FIG. 2, other embodiments are within the scope and spirit of the invention. For example, in the embodiment described, the gate of transistor Mc2a receives a reference voltage, and cascode transistor Mc2b receives voltage biasDrive. In an alternative embodiment, transistor Mc2b receives a bias voltage, and transistor Mc2a receives a voltage that changes based on the negative feedback.

FIG. 2 illustrates a particular architecture for folded cascode 220, which includes split cascode 230. Other embodiments of folded cascode 220 including split cascode 230 may have different architectures.

Although FIG. 2 illustrates an embodiment that includes FETs, in another embodiment, some or all of the FETs may be replaced with BJTs, or the like.

Also, although FIG. 2 illustrates an embodiment which includes n-type transistors referenced to ground, in another embodiment, the n-type transistors referenced to ground may be replaced with p-type transistors referenced to the top rail.

Figure 3:
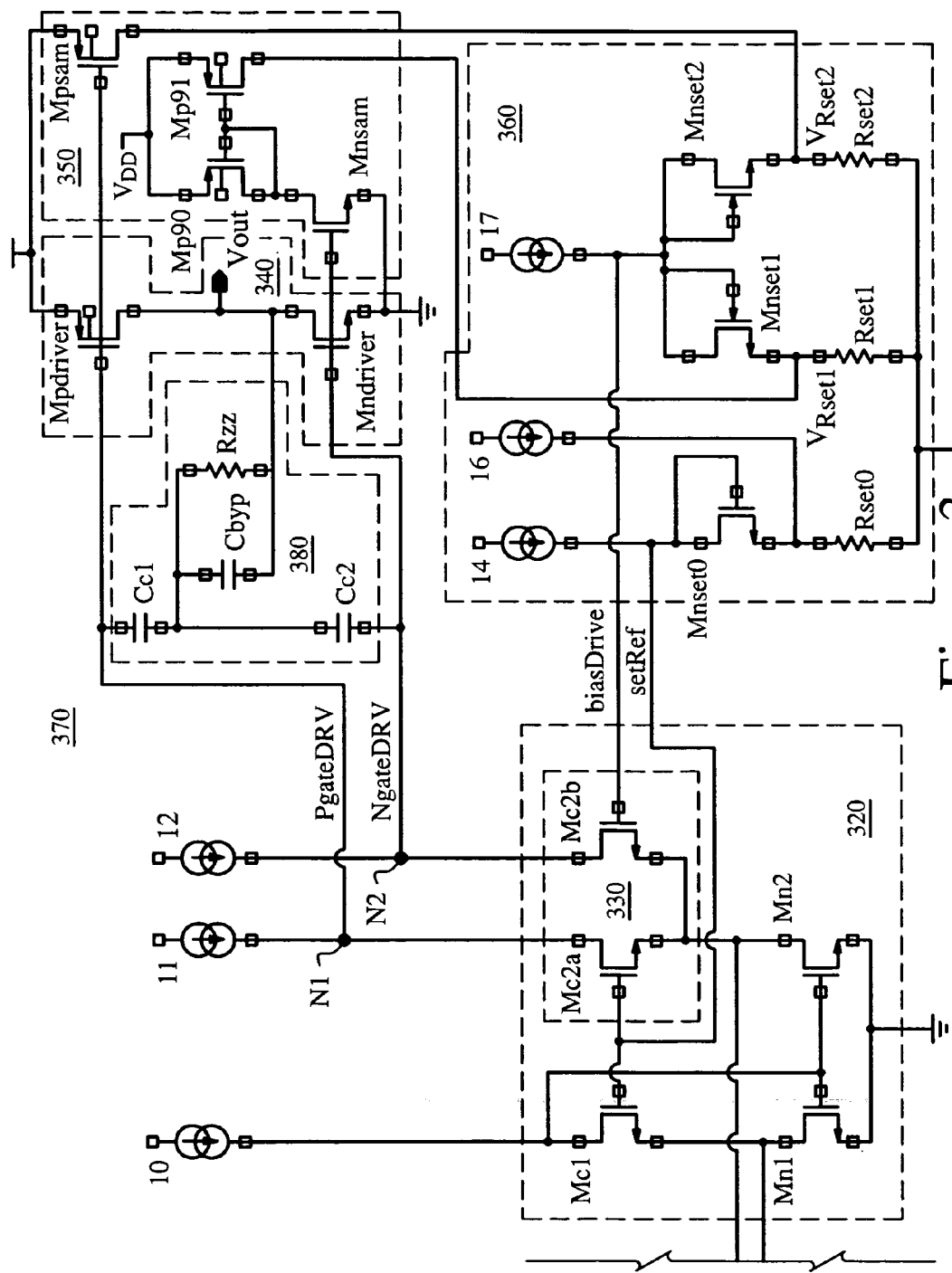
FIG. 3 schematically illustrates an embodiment of the class AB amplifier of FIG. 2.
Figure 3:
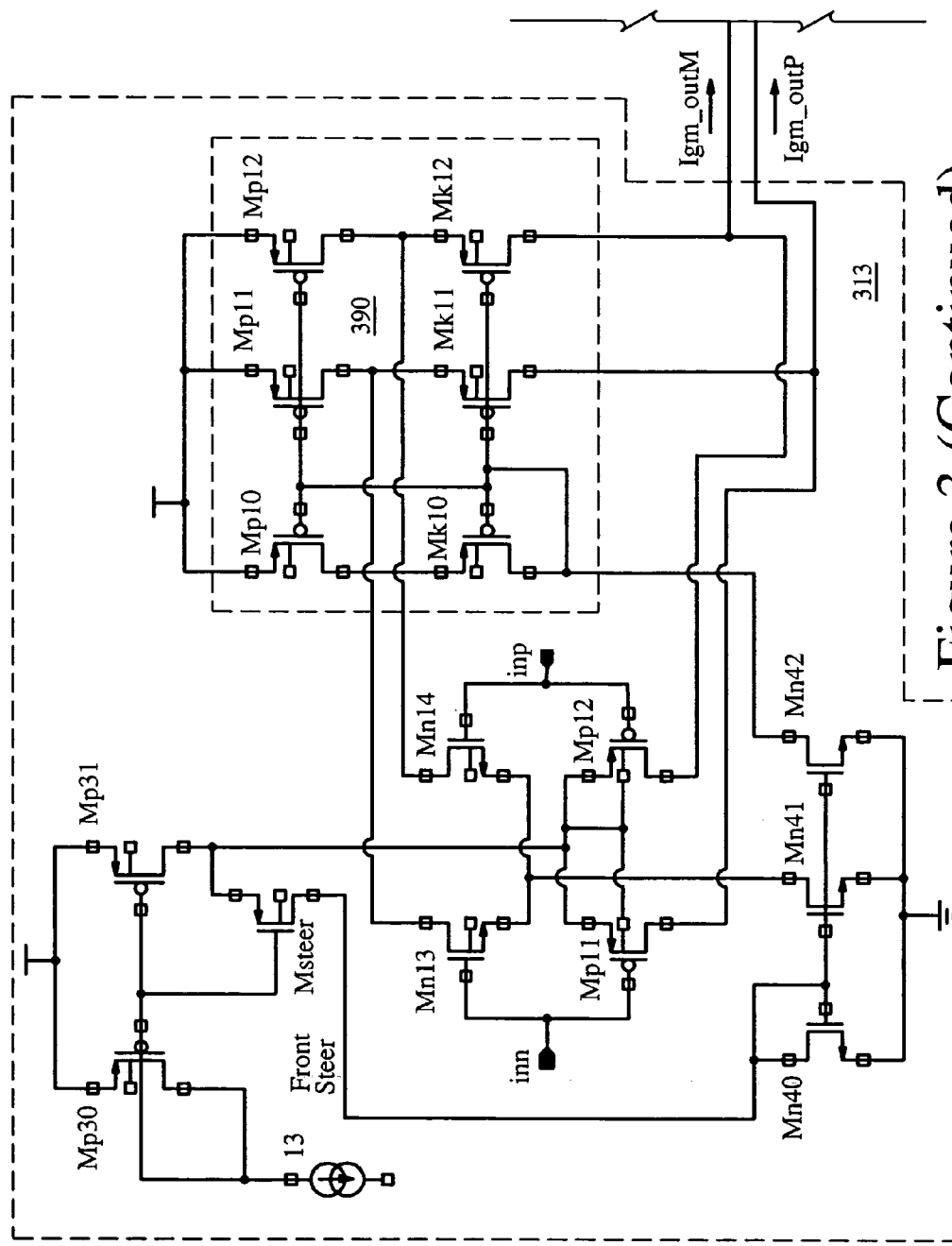

FIG. 3 schematically illustrates an embodiment of class AB amplifier 370. Class AB amplifier 370 may be employed as an embodiment of class AB amplifier 270 of FIG. 2. Class AB amplifier 370 further includes compensation network 380. Compensation network 380 includes capacitor Cc1, capacitor Cc2, capacitor Cbyp, and resistor Rzz. Also, Class AB output stage 340 includes high-side driver transistor Mpdriver and low-side driver transistor Mndriver. Sampling circuit 350 includes high-side sampling transistor Mpsam, low-side sampling transistor Mnsam, and a current mirror including transistors Mp90 and Mp91. Additionally, split-cascode bias circuit 360 includes transistors Mnset0–Mnset2, resistors Rset0–Rset2, and current sources I4, I5, and I7. Gm stage 313 includes current source I3 and transistors. Class AB amplifier 370 is suitable for low-voltage applications, such as 1.6V.

Gm stage 313 is a rail-to-rail input transconductance stage. Transistors Mpi1 and Mpi2 are arranged as a p-type differential pair, and transistors Mni3 and Mni4 are arranged as an n-type differential pair. Also, transistor Mp30, Mp31, and steer transistor M31 operate as a front steer circuit. During normal operating conditions, the p-type differential pair receives substantially all of current I3 as a tail current. However, as the common mode voltage of differential input voltage Vin (differential voltage Vin includes voltages inp and inn) approaches upper rail voltage Vdd, transistor Msteer steers a portion of current I3 away from the p-type differential pair to the drain of transistor M40. The closer common mode voltage gets to Vdd, the more current is streered away from the p-type differential pair.

Additionally, transistors Mn40, Mn41, and Mn42 operate as a current mirror circuit with an input at the drain of transistor Mn40, a first output at the drain of transistor Mn41, and a second output at the drain of transistor Mn42. The current steered away from the p-type differential pair is mirrored to the n-type differential pair as a tail current, and is also mirrored to another current mirror circuit 390 that includes transistors Mp10, Mp11, Mp12, Mk10, Mk11, and Mk12. Current mirror circuit 390 is arranged to provide current to the differential output of gm stage 313 based on the amount of current steered by steer transistor Msteer. This way, currents Igm_outP and Igm_outM each have a substantially constant bias current regardless of the common mode voltage.

Transistor Mpsam is arranged to sample the current through high-side driver transistor Mpdriver, and the sampled current is provided to resistor Rset2. Similarly, transistor Mnsam is arranged to sample the current through low-side driver transistor Mndriver, and transistors Mp90 and Mp91 are arranged to mirror the low-side driver transistor sampled current to resistor Rset1. Also, resistor Rset1 is arranged to provide voltage VRset1 based on the current through resistor Rset2, and resistor Rset2 is arranged to provide voltage VRset2 based on the current through resistor Rset2. In other embodiments, one or both of resistors Rset1 and Rset2 may be replaced with a different type of impedance circuit.

Transistors Mnset1 and Mnset2 are each arranged to operate as a diode circuit. In alternative embodiments, one or both of transistors Mnset1 and Mnset2 may be replaced with a different type of diode circuit, such as a p-n junction. Current source I7 is arranged to provide a DC bias current to the diode circuits.

Current sources I4 and I5, resistor Rset0, and transistor Mnset0 are arranged to provide voltage setRef, so that each has the same bias current that nominally flows through transistor Mnset1, resistor Rset1, transistor Mnset2, and resistor Rset2.

As an oversimplification, split-cascode bias circuit 360 may be viewed as operating as a minimum selector for voltages VRset1 and VRset2, providing the lesser of the two voltages, plus a VGS, as voltage biasDrive. This is an oversimplification because bias voltage 17 also has an effect.

If voltages VRset1 and VRset2 are equal, voltage biasDrive is equal to voltage VRset1, plus a VGS, and transistors Mnset1 and Mnset2 each have a current of I7/2 through them. However, if one of the two voltages VRset1 and VRset2 becomes significantly greater than the other, the diode circuit on that branch will become back-biased. This causes that diode circuit to have substantially no current, and the diode circuit in the other branch to have a current of substantially I7.

If bias current I7 is relatively negligible, voltage biasDrive is set by the smaller of the two sampled currents. Accordingly, the smallest current of the high-side transistor and the low-side transistor is the quiescent current. Since the unloaded driver transistor is not turned off, it can respond rapidly to changing loading conditions.

If bias current I7 is not completely negligible, the unloaded driver transistor may drop a little, in part because diode circuits Mnset1 and Mnset2 are not ideal.

In a preferred embodiment, class AB amplifier circuit 370 has a high open loop gain with a short, simple signal path having only two gm stages. The complexity of the AB biasing is kept out of the main signal path, and is instead included in sampling circuit 350 and split-cascode bias circuit 360. In part because of the simple signal path, a relatively simple compensation network may be employed for compensation network 380.

Figure 4:
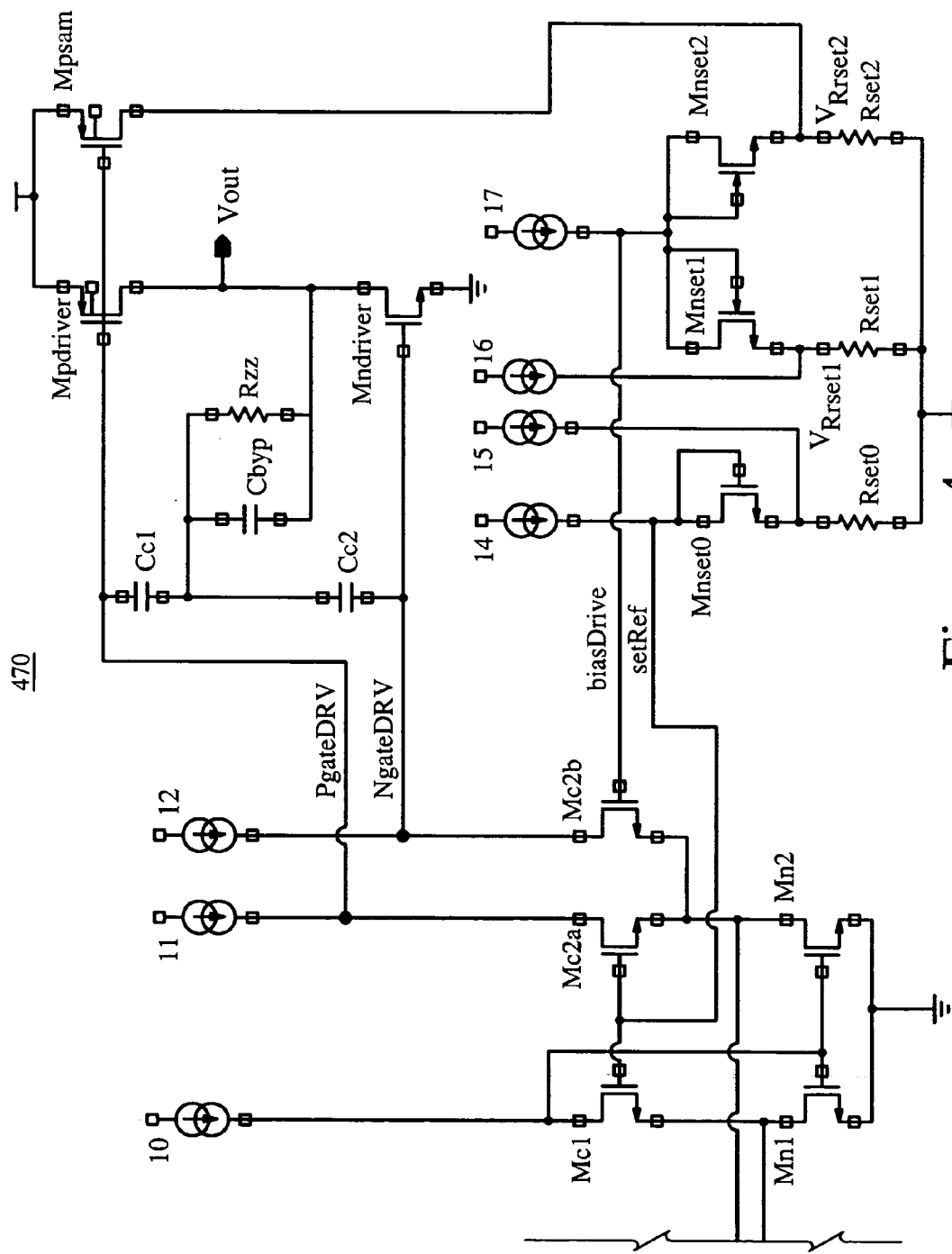
FIG. 4 shows a schematic diagram of an embodiment of the class AB amplifier of FIG. 3 that employs single sampling rather than double sampling, arranged in accordance with aspects of the invention.
Figure 4:
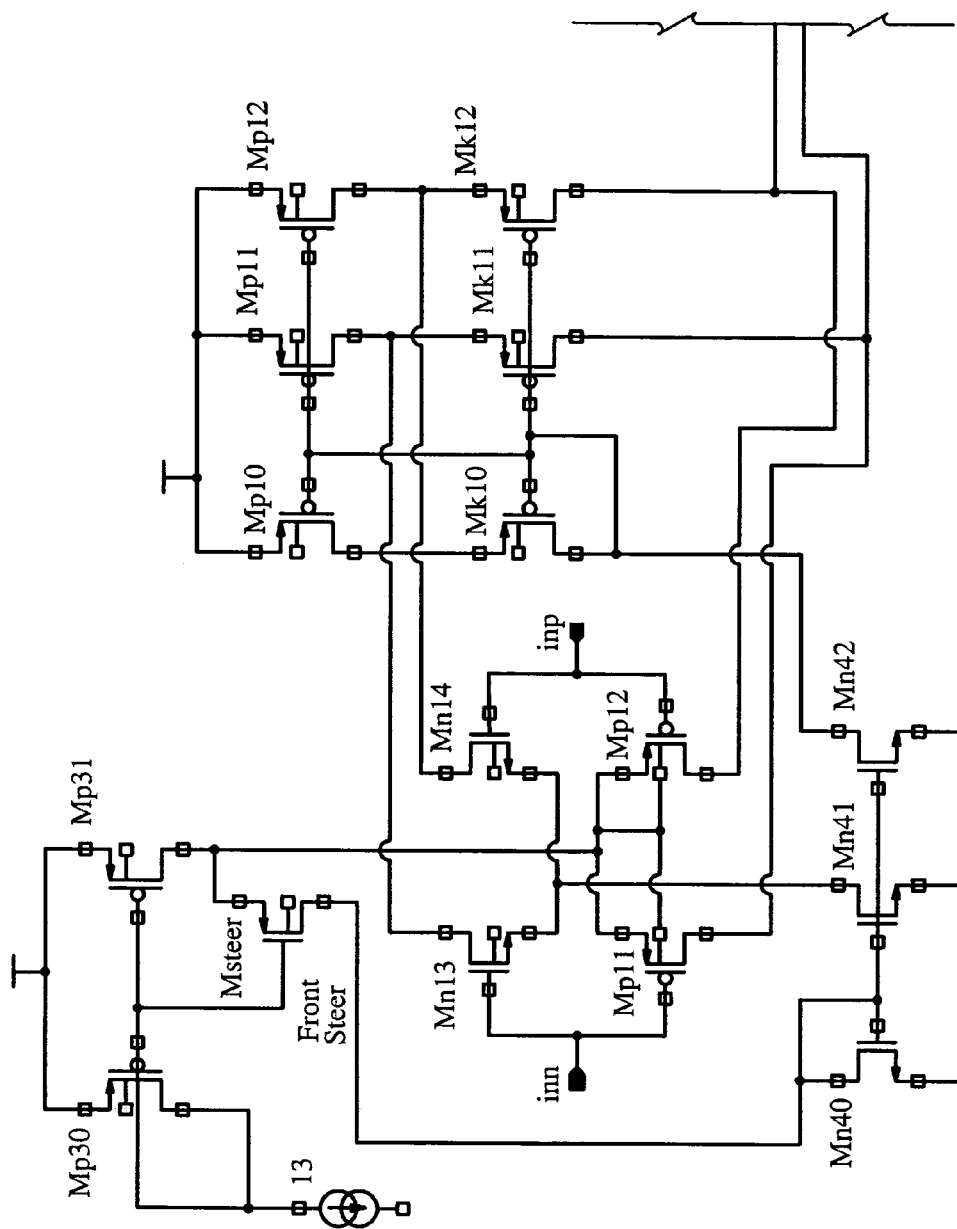

FIG. 4 shows a schematic diagram of an embodiment of the class AB amplifier 470, which may be employed as an embodiment of class AB amplifier 270 of FIG. 2. Class AB amplifier is similar to class AB amplifier 370 of FIG. 3, except that is employs single sampling rather than double sampling. Rather than comparing the high-side transistor sampled current with the low-side transistor sampled current, the high-side transistor sampled current is compared with a reference current provided by current source I6.

The above specification, examples and data provide a description of the manufacture and use of the composition of the invention. Since many embodiments of the invention can be made without departing from the spirit and scope of the invention, the invention also resides in the claims hereinafter appended.

What is claimed is:

1. A class AB amplifier circuit, comprising:
    a folded cascode circuit including a split cascode, wherein the split cascode includes:
        a first cascode transistor including a source and a gate, wherein the first cascode transistor is arranged to receive a first cascode bias voltage at the gate of the first cascode transistor; and
        a second cascode transistor including a gate, and further including a source that is coupled to the source of the first cascode transistor, wherein the second cascode transistor is arranged to receive a second cascode bias voltage at the gate of the second cascode transistor, and wherein the class AB amplifier circuit is arranged such that at least one of the first cascode bias voltage or the second cascode bias voltage is based, in part, on at least one of a current associated with a high-side driver transistor or a current associated with a low-side driver transistor.

2. The class AB amplifier circuit of claim 1, where the first cascode transistor is a bipolar junction transistor, the source of the first cascode transistor is an emitter, the second cascode transistor is another bipolar junction transistor, the source of the second cascode transistor is another emitter, the gate of the first cascode transistor is a base, and the gate of the second cascode transistor is another base.

3. The class AB amplifier circuit of claim 1, further comprising:
    a first transconductance stage that is coupled to the folded cascode circuit; and
    a class AB output stage, including:
        the high-side driver transistor, wherein the high-side driver transistor is coupled to the first cascode transistor and an output node; and
        the low-side driver transistor, wherein the low-side driver transistor is coupled to the second cascode transistor and the output node.

4. A class AB amplifier circuit, comprising:
    a folded cascode circuit including a split cascode, wherein the split cascode includes:
        a first cascode transistor including a source and a gate; and
        a second cascode transistor including a gate, and further including a source that is coupled to the source of the first cascode transistor;
    a first transconductance stage that is coupled to the folded cascode circuit;

a class AB output stage, including:
   a high-side driver transistor that is coupled to the first cascode transistor and an output node; and
   a low-side driver transistor that is coupled to the second cascode transistor and the output node; and
a sample-and-feedback circuit that is arranged to provide a first cascode bias voltage and a second cascode bias voltage based, in part, on a current that is associated with the class AB output stage such that class AB biasing is provided, wherein the first cascode transistor is arranged to receive the first cascode bias voltage at the gate of the first cascode transistor, and wherein the second cascode transistor is arranged to receive the second cascode bias voltage at the gate of the second cascode transistor.

5. A class AB amplifier circuit, comprising:
a folded cascode circuit including a split cascode, wherein the split cascode includes:
   a first cascode transistor including a source and a gate; and
   a second cascode transistor including a gate, and further including a source that is coupled to the source of the first cascode transistor;
a first transconductance stage that is coupled to the folded cascode circuit;
a class AB output stage, including:
   a high-side driver transistor that is coupled to the first cascode transistor and an output node; and
   a low-side driver transistor that is coupled to the second cascode transistor and the output node; and
a sampling circuit that is coupled to at least one of the high-side driver transistor and the low-side driver transistor; and
a split-cascode bias circuit that is coupled to the sampling circuit, the first cascode transistor, and the second cascode transistor.

6. The class AB amplifier circuit of claim 5, wherein:
the sampling circuit is arranged to provide at least one of:
   a high-side driver transistor sampled current that is substantially proportional to a current that is associated with the high-side driver transistor, and
   a low-side driver transistor sampled current that is substantially proportional to a current that is associated with the low-side driver transistor.

7. The class AB amplifier circuit of claim 6, wherein the sampling circuit is arranged to provide both the high-side driver transistor sampled current and the low-side transistor sampled current.

8. The class AB amplifier circuit of claim 6, wherein the split-cascode bias circuit is arranged to provide a first cascode bias voltage and a second bias voltage such that at least one of the first and second cascode bias voltages is based, in part, on at least one of the high-side driver transistor sampled current and the low-side transistor sampled current; the first cascode transistor is arranged to receive the first cascode bias voltage at the gate of the first cascode transistor; the second cascode transistor is arranged to receive the second cascode bias voltage at the gate of the second cascode transistor; and wherein the split-cascode bias circuit is arranged to provide the first cascode bias voltage and the second cascode bias voltage based on negative feedback such that, if one of the high-side transistor and the low-side transistor is loaded and the other is unloaded, a quiescent current associated with the unloaded transistor is controlled based, in part, on the negative feedback.

9. The class AB amplifier circuit of claim 5, wherein the split-cascode bias circuit is arranged to provide a first cascode bias voltage and a second cascode bias voltage, and wherein the split-cascode bias circuit includes:
   a reference voltage circuit that is arranged to provide a first cascode bias voltage;
   a first impedance circuit that is coupled to a first bias circuit input node;
   a second impedance circuit that is coupled to a second bias circuit input node;
   a first diode circuit that is coupled between the first bias circuit input node and the gate of the second cascode transistor;
   a second diode circuit that is coupled between the second bias circuit input node and the gate of the second cascode transistor.

10. The circuit of claim 9, wherein the first diode circuit and the second diode circuit each include at least one of a diode, a bipolar junction transistor that is arranged in a diode configuration, and a field effect transistor that includes a gate and a drain that are coupled together.

11. The circuit of claim 9, wherein:
the sampling circuit is arranged to provide at least one of:
   a high-side driver transistor sampled current that is substantially proportional to a current that is associated with the high-side driver transistor, and
   a low-side driver transistor sampled current that is substantially proportional to a current that is associated with the low-side driver transistor; and
wherein the split-cascode bias circuit is arranged to receive at least one of the low-side transistor sampled current and the high-side transistor sampled current at at least one of the first and second bias input nodes.

12. The circuit of claim 11, wherein the split-cascode bias circuit is arranged to receive the low-side transistor sampled current at the first bias circuit input node, and to receive the high-side transistor sampled current at the second bias circuit input node.

13. The circuit of claim 11, wherein the split bias circuit is arranged to receive a reference current at the first bias circuit input node, and to receive the high-side transistor sampled current at the second bias circuit input node.

14. The class AB amplifier circuit of claim 1, further comprising:
a transconductance stage that is arranged to provide a transconductance stage output current based, in part, on a differential input voltage, wherein
the folded cascode circuit is arranged to provide a split cascode input current in response to the transconductance stage output current; the first cascode transistor is arranged to provide a first cascode output signal based, in part, on a first portion of the split cascode input current; and wherein the second cascode transistor is arranged to provide a second cascode output signal based, in part, on a second portion of the split cascode input current.

15. A class AB amplifier circuit, comprising:
a folded cascode circuit including a split cascode, wherein the split cascode includes:
   a first cascode transistor including a source and a gate; and
   a second cascode transistor including a gate, and further including a source that is coupled to the source of the first cascode transistor; and
a transconductance stage that is arranged to provide a transconductance stage output current based, in part, on a differential input voltage, wherein the folded cascode circuit is arranged to provide a split cascode input current in response to the transconductance stage output current; the first cascode transistor is arranged to provide a first cascode output signal based, in part, on a first portion of the split cascode input current; the second cascode transistor is arranged to provide a second cascode output signal based, in part, on a second portion of the split cascode input current;

the transconductance stage is a rail-to-rail transconductance circuit; and wherein the transconductance stage is arranged to provide the transconductance stage output current as a differential current.

16. A class AB amplifier circuit, comprising:

a folded cascode circuit including a split cascode, wherein the split cascode includes:
  a first cascode transistor including a source and a gate; and
  a second cascode transistor including a gate, and further including a source that is coupled to the source of the first cascode transistor; and
a transconductance stage that is arranged to provide a transconductance stage output current based, in part, on a differential input voltage, wherein the folded cascode circuit is arranged to provide a split cascode input current in response to the transconductance stage output current; the first cascode transistor is arranged to provide a first cascode output signal based, in part, on a first portion of the split cascode input current; the second cascode transistor is arranged to provide a second cascode output signal based, in part, on a second portion of the split cascode input current, the transconductance stage is arranged to provide the transconductance stage output current as a differential current; and wherein the folded cascode further includes a third cascode transistor including a gate that is coupled to the gate of the first cascode transistor.

17. The class AB amplifier circuit of claim 15, wherein the transconductance stage includes a differential output, the transconductance stage is arranged to provide the transconductance stage output current at the differential output, and wherein the transconductance stage includes:
  a current source that is arranged to provide a first current;
  a front steer circuit that is arranged to, if a common mode voltage of the differential input voltage is close to an upper rail voltage, provide a steer current based on how close the common mode voltage is to the upper rail voltage, such that a p-type differential tail current is substantially equal to the first current minus the steer current;
  a p-type differential pair that is arranged to receive the differential input voltage, and further arranged to receive the p-type differential pair tail current, wherein the p-type differential pair includes a differential output that is coupled to the differential output of the transconductance circuit;
  an n-type differential pair that is arranged to receive the differential input voltage, wherein the n-type differential pair includes a differential output, and wherein the n-type differential pair is arranged to provide an n-type pair differential output current at the differential output of the n-type differential pair;
  a first current mirror circuit that is arranged to provide first and second output mirror currents based on the steer current, wherein the n-type differential pair is arranged to receive the first output mirror current as a tail current;

a second current mirror circuit that is coupled to the differential output of the n-type differential pair, wherein the second current mirror circuit is arranged to receive the second mirror output current, and further arranged to provide a second current mirror differential output current to the differential output of the transconductance output stage based on the second mirror output current and the n-type pair output current such that the transconductance stage output current has a substantially constant bias current.

18. A class AB amplifier circuit, comprising:

a folded cascode circuit including a split cascode, wherein the split cascode is arranged to receive a split cascode input current and first and second cascode bias voltages, and wherein the split cascode includes:
  a first cascode transistor including a gate, a drain, and a source, wherein the first cascode transistor is arranged to receive a first cascode bias voltage at the gate of the first cascode transistor, to receive a first portion the split cascode input current at the source of the first cascode transistor, and to provide a first cascode output signal at the drain of the first cascode transistor;
  a second cascode transistor including a gate, a drain, and a source, wherein the second cascode transistors is arranged to receive a second cascode bias voltage at the gate of the second cascode transistor, to receive a second portion the split cascode input current at the source of the second cascode transistor, and to provide a second cascode output signal at the drain of the second cascode transistor, wherein the split cascode is configured such that a ratio of the first portion of the split cascode input current and the second portion of the split cascode input current is based, in part, on a difference between the first cascode bias voltage and the second cascode bias voltage; and
  wherein the class AB amplifier circuit is arranged such that the split cascode input current is based, in part, on an amplifier differential input voltage; and such that an amplifier output voltage is based, in part, on the first and second cascode output signals, wherein the class AB amplifier circuit is arranged such that at least one of the first cascode bias voltage or the second cascode bias voltage based, in part, on at least one of a current associated with a high-side transistor or a current associated with a low-side transistor.

19. A class AB amplifier circuit, comprising:

a folded cascode circuit including a split cascode, wherein the split cascode is arranged to receive a split cascode input current and first and second cascode bias voltages, and wherein the split cascode includes:
  a first cascode transistor including a gate, a drain, and a source, wherein the first cascode transistor is arranged to receive a first cascode bias voltage at the gate of the first cascode transistor, to receive a first portion the split cascode input current at the source of the first cascode transistor, and to provide a first cascode output signal at the drain of the first cascode transistor;
  a second cascode transistor including a gate, a drain, and a source, wherein the second cascode transistors is arranged to receive a second cascode bias voltage at the gate of the second cascode transistor, to receive a second portion the split cascode input current at the source of the second cascode transistor, and to provide a second cascode output signal at the drain of the second cascode transistor, wherein the split cascode is configured such that a ratio of the first portion of the split cascode input current and the second portion of the split cascode input current is based, in part, on a difference between the first cascode bias voltage and the second cascode bias voltage; and wherein the class AB amplifier circuit is arranged such that the split cascode input current is based, in part, on an amplifier differential input voltage; and such that an amplifier output voltage is based, in part, on the first and second cascode output signals;

a first transconductance stage that is arranged to provide a transconductance stage output current based, in part, on the amplifier differential input voltage, wherein the folded cascode circuit is arranged to provide the split cascode input current in response to the transconductance stage output current, the transconductance stage output current is a differential current that includes a first half and a second half, and wherein the folded cascode is arranged to receive the first half of the transconductance stage output current at a first node, and to receive the second half of the transconductance stage output current at a second node;

a class AB output stage, including:
a high-side driver transistor that is coupled to the first cascode transistor and an output node; and
a low-side driver transistor that is coupled to the second cascode transistor and the output node, wherein the class AB output stage is arranged to provide the amplifier output voltage at the output node;

a sampling circuit that is arranged to provide at least one of: a high-side driver transistor sampled current that is substantially proportional to a current that is associated with the high-side driver transistor, and a low-side driver transistor sampled current that is substantially proportional to a current that is associated with the low-side driver transistor; and a split-cascode bias circuit that is arranged to receive a split-cascode bias circuit input signal, wherein the split-cascode bias circuit input signal includes at least one of the high-side driver transistor sampled current and the low-side transistor sampled current, and further arranged to provide the first cascode bias voltage and the second cascode bias voltage based, in part, on the split-cascode bias circuit input signal such that class AB biasing is provided, wherein the folded cascode circuit further includes a third cascode transistor including a gate, a source, and a drain, wherein the gate of the third cascode transistors is coupled to the gate of the first cascode transistor, and wherein the source of the third cascode transistor is coupled to the first node.

20. A method for class AB amplification, comprising:

providing a transconductance output current based on an input signal according to a first transconductance;

employing a split cascode to provide a first cascode output signal and a second output signal based, in part, on the transconductance output current, a first cascode bias voltage, and a second cascode bias voltage;

driving a high-side transistor based, in part, on the first cascode output signal;

driving a low-side transistor based, in part, on the second cascode output signal; and providing at least one of the first and second cascode bias voltages based, in part, on at least one of a current associated with the high-side transistor and a current associated with the low-side transistor.

* * * * *

UNITED STATES PATENT AND TRADEMARK OFFICE
CERTIFICATE OF CORRECTION

| | | |
|---|---|---|
| PATENT NO. | : 7,164,317 B1 | Page 1 of 1 |
| APPLICATION NO. | : 11/003299 | |
| DATED | : January 16, 2007 | |
| INVENTOR(S) | : Perry Scott Lorenz | |

It is certified that error appears in the above-identified patent and that said Letters Patent is hereby corrected as shown below:

On The Title Page item 56
First Page Col. 1 (U.S. Patent Documents); Line 4; After 6,781,463" delete "B1" and insert -- B2 --, therefor.

In the Drawings
Sheet 3 of 7 Below Referral Numeral 230 (Figure 2); Line 2; Delete "$I_{splcase\_in}$" and insert -- $I_{splcasc\_in}$ -- therefor.

Sheet 4 of 7 Below Referral Numeral 350 (Figure 3); Line 1; Delete "$V_{DD}$" and insert -- $V_{dd}$ --, therefor.

Sheet 6 of 7 (Figure 4); Line 1; Delete "$V_{Rrset1}$" and insert -- $V_{Rset1}$ --, therefor.

Sheet 6 of 7 (Figure 4); Line 1; Delete "$V_{Rrset2}$" and insert -- $V_{Rset2}$ --, therefor.

Column 2; Line 60; Delete "10-12," and insert -- 10-12, --, therefor.

Column 4; Line 14; Delete "Ngate DRV" and insert -- NgateDRV --, therefor.

Column 5; Line 46; Delete "17" and insert -- 17--, therefor.

Column 8; Lines 32-33; In Claim 11, after "current at" delete "at".

Signed and Sealed this

Third Day of April, 2007

JON W. DUDAS
*Director of the United States Patent and Trademark Office*